United States Patent
Mauder et al.

(10) Patent No.: US 10,254,327 B2
(45) Date of Patent: Apr. 9, 2019

(54) METHOD AND DEVICE FOR SHORT CIRCUIT DETECTION IN POWER SEMICONDUCTOR SWITCHES

(71) Applicant: Infineon Technologies AG, Neubiberg (DE)

(72) Inventors: Anton Mauder, Kolbermoor (DE); Stefan Hain, Creussen (DE); Mark-Matthias Bakran, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 345 days.

(21) Appl. No.: 15/058,632

(22) Filed: Mar. 2, 2016

(65) Prior Publication Data

US 2017/0248646 A1    Aug. 31, 2017

Related U.S. Application Data

(63) Continuation-in-part of application No. 15/056,111, filed on Feb. 29, 2016, now abandoned.

(51) Int. Cl.
| | |
|---|---|
| *G05F 1/573* | (2006.01) |
| *G01R 31/02* | (2006.01) |
| *H03K 17/082* | (2006.01) |
| *G01R 31/327* | (2006.01) |
| *G01R 31/27* | (2006.01) |
| *H03K 17/0812* | (2006.01) |
| *G01R 31/42* | (2006.01) |

(52) U.S. Cl.
CPC ........... *G01R 31/025* (2013.01); *G01R 31/27* (2013.01); *G01R 31/3277* (2013.01); *H03K 17/0828* (2013.01); *H03K 17/08128* (2013.01); *G01R 31/42* (2013.01); *G05F 1/573* (2013.01); *H03K 17/0826* (2013.01)

(58) Field of Classification Search
USPC .................................. 361/86–87, 93.7–93.9
See application file for complete search history.

(56) References Cited

U.S. PATENT DOCUMENTS

| | | | | |
|---|---|---|---|---|
| 5,375,029 | A * | 12/1994 | Fukunaga | G05F 1/573 323/285 |
| 6,057,728 | A * | 5/2000 | Igarashi | H03K 17/0828 327/427 |
| 7,295,412 | B2 * | 11/2007 | Sasaki | B60K 6/485 361/91.1 |
| 7,483,250 | B2 * | 1/2009 | Ishikawa | H03K 17/0828 361/101 |
| 2001/0026429 | A1 | 10/2001 | Fukuda et al. | |
| 2004/0207967 | A1 | 10/2004 | Ohshima et al. | |
| 2009/0128106 | A1 | 5/2009 | Takahashi et al. | |

(Continued)

OTHER PUBLICATIONS

Lizama, Ignacio et al., "A New Method for Fast Short Circuit Protection of IGBTs", Industrial Electronics Society, IECON 2014—40th Annual Conference of the IEEE, pp. 1072-1076.

*Primary Examiner* — Danny Nguyen
(74) *Attorney, Agent, or Firm* — Muprhy, Bilak & Homiller, PLLC

(57) ABSTRACT

Devices and methods are provided, which detect a short circuit condition related to a semiconductor switch. A short circuit condition may be determined when a control signal of the switch exceeds a first reference, and a change of load current of the switch exceeds a second reference.

14 Claims, 6 Drawing Sheets

(56) References Cited

U.S. PATENT DOCUMENTS

| | | | |
|---|---|---|---|
| 2010/0134939 A1 | 6/2010 | Takahashi et al. | |
| 2012/0013370 A1* | 1/2012 | Mori | H03K 17/0828 327/109 |
| 2012/0092912 A1 | 4/2012 | Eckel et al. | |
| 2012/0153719 A1* | 6/2012 | Inaba | B60L 3/003 307/10.1 |
| 2013/0314064 A1 | 11/2013 | Theiler et al. | |
| 2014/0192449 A1* | 7/2014 | Shimizu | H03K 17/0828 361/93.1 |
| 2017/0192049 A1 | 7/2017 | Tavernier et al. | |

\* cited by examiner

METHOD AND DEVICE FOR SHORT CIRCUIT DETECTION IN POWER SEMICONDUCTOR SWITCHES

TECHNICAL FIELD

The present application relates to short circuit detection for power semiconductor switches.

BACKGROUND

Power semiconductor switch devices, like power metal oxide semiconductor field effect transistors (MOSFETs) or insulated gate bipolar transistors (IGBT) are used to switch high voltages and/or currents. For example, in the automotive field such power semiconductor switches may be used to selectively couple an electric motor with supply voltages in the order to some hundreds of volts, with corresponding high currents of the order of above 10A. In case of a short circuit occurring e.g. in a load coupled to the switch, due to the high voltages extremely high currents may flow, which may damage or even destroy the semiconductor switch device. Therefore, it is desirable to detect such short circuit conditions and take appropriate steps, for example open (switch off) the semiconductor switch device thus interrupting any current flow.

Conventional approaches use a desaturation behavior of the semiconductor switch device to detect short circuits. Desaturation behaviour in the context of this application means that the semiconductor switch is limiting a current flow through load terminals of the semiconductor switch and at least a major portion of a supply voltage drops across the load terminals of the semiconductor switch. However, this approach is not suitable for all semiconductor devices and short circuit situations.

SUMMARY

According to an embodiment of a device, the device comprises: a semiconductor switch comprising a control terminal and at least two load terminals; and an evaluation circuit configured to detect a short circuit condition based on a magnitude of a signal at the control terminal and based at least in part on a magnitude of a variation of a load current via the at least two load terminals.

According to another embodiment of a device, the device comprises: a power transistor comprising a first load terminal, a second terminal and a control terminal; a first comparator comprising a first input coupled with the control terminal and a second input to be coupled with a first reference voltage; a second comparator comprising a first input coupled with the second load terminal and a second input to be coupled with a second reference voltage; and an AND gate comprising a first input coupled with an output of the first comparator and a second input coupled with an output of the second comparator.

According to an embodiment of a method of short circuit detection, the method comprises: providing a first voltage at a control terminal of a semiconductor switch; providing a second voltage indicative of a load current change of the semiconductor switch; and detecting a short circuit condition based on a magnitude of the first voltage and of the second voltage.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
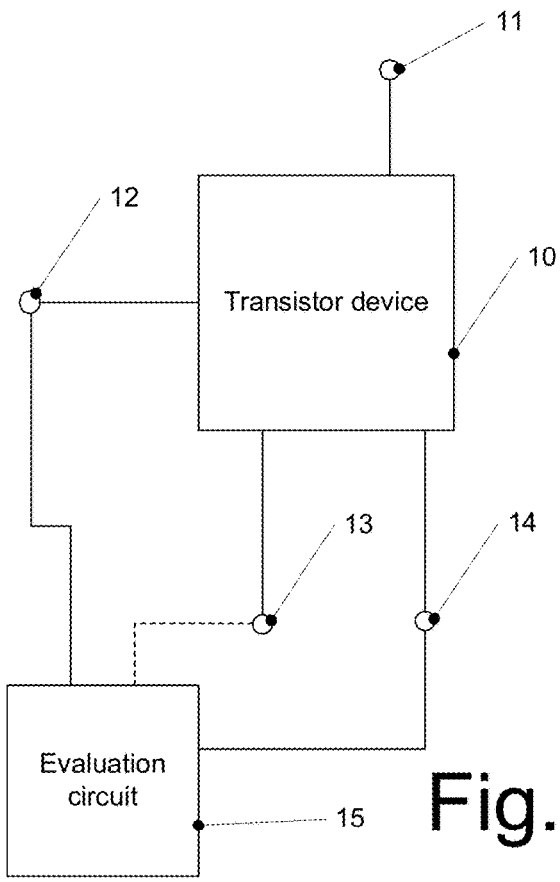
FIG. 1 is block diagram of a device according to an embodiment.

In the following, various embodiments will be discussed in detail referring to the attached drawings. These embodiments are only given by way of example and are not be understood in a limiting sense. For example, describing an embodiment with a plurality of features or components is not to be construed as indicating that all these features or components are necessary for implementation of embodiments. Instead, in other embodiments some of the features or components described may be omitted, and/or may be replaced by alternative features or components. Moreover, apart from the features and components explicitly shown and described, other features or components, for example components conventionally used in power semiconductor devices and associated circuits, may be provided.

Features or components from various embodiments may be combined to form further embodiments. A modification or variation described with respect to one of the embodiments may also be applicable to other embodiments.

Electrical connections or couplings shown in the drawings or described herein may be direct connections or couplings, i.e. direct connections or couplings without intervening elements (for example simple metal connections), or may be indirect connections or couplings, i.e. connections or couplings with one or more additional intervening elements, as long as the general purpose of the connection or coupling, for example to transmit a certain kind of signal, to transmit a certain kind of information or to provide a certain kind of control, is essentially maintained. Connections or couplings may be wire-based connections or couplings (for example metal connections) or wireless connections or couplings unless noted otherwise. Any numerical values given herein are merely for illustration purposes and may vary depending on an implementation.

In embodiments, transistors are used as semiconductor power switches. Generically, transistors are being described as comprising a control terminal and at least two load terminals herein. For example, in case of a field effect transistor (FET) like a metal oxide semiconductor FET (MOSFET), the control terminal is a gate terminal, and the load terminals includes source and drain terminals. In case of a bipolar transistor, the control terminal is a base terminal, and the load terminals are collector and emitter terminals. In case of an insulated gate bipolar transistor (IGBT), the control terminal is a gate terminal, and the load terminals are collector and emitter terminals. Generally, by applying appropriate signals, for example voltages, to the control terminal, a transistor may be switched between an open or non-conducting state, where the transistor is essentially non-conducting between its load terminals (apart from possible small leakage currents) and a conducting or closed state, where the transistor provides a low ohmic connection between its load terminals. The open state is also referred to as a switched-off state, and the closed state is also referred to as a switched-on state of the transistor herein. In embodiments, such transistors are used as power devices to switch comparatively high voltages and/or currents via their load terminals.

Furthermore, embodiments use one or more auxiliary terminals, for example one or more auxiliary emitters. An auxiliary terminal as used herein is a terminal which is connected with the same contact of the respective semiconductor device (transistor) on a chip die (for example emitter contact or emitter contact area) as a load terminal the auxiliary terminal is associated with, but is not used to carry the load current to be switched. For example, in case of a power IGBT, an emitter contact on the chip may be coupled with an emitter terminal as load terminal of a chip package via one or a plurality of bond wires, and when the transistor is closed, current to be switched may flow via these bond wires to the emitter terminal. Additionally, the emitter contact of the chip may be coupled with an additional bond wire (or a plurality of additional bond wires) with an additional auxiliary emitter terminal as auxiliary terminal, which is not used to carry the load current As will be explained below such an auxiliary terminal may for example be used to apply a control voltage, for example a gate-emitter voltage. Furthermore, in embodiments such an auxiliary terminal may be used for measurements enabling to detect a short circuit condition.

Some embodiments relate to short circuit detection. A short circuit as used herein generally may refer to a condition which causes a load current above a threshold value to flow via load terminals of a semiconductor power switch when the switch is closed. The threshold value is larger than current values expected to flow in normal operation. A current above the threshold value may be outside a range for which the switch device is specified, and may lead to damaging of the switch device at least after some time. Such a short circuit may for example be caused by an accidental low impedance coupling of a load terminal of the switch device to ground or a negative supply voltage while another load terminal is coupled to a positive supply voltage. It should be noted that as each electrical connection usually employed in electronic circuits has some impedance (even if minimal), there is always some load resistance and inductivity coupled to the switch device.

In some embodiments, a short circuit condition may be detected based on a magnitude of a control signal applied to the control terminal and on the magnitude of a signal caused by a load current, in particular by a change of the load current, at a load terminal. Both magnitudes may be measured with respect to a magnitude of a signal at an auxiliary terminal. In some embodiments, short circuit conditions may be detected early even for semiconductor devices which have a comparatively high desaturation current, i. e. semiconductor devices showing no desaturation behavior at a certain (over-) current level for which a short circuit should already be detected. Therefore, semiconductor devices having such a high desaturation current may be used, which may have a higher conductivity in a closed state.

Turning now to the Figures, in FIG. 1 a device according to an embodiment is illustrated. The device of FIG. 1 comprises a transistor device 10. Transistor device 10 in embodiments is a power transistor device designed to switch high voltages and/or high current. In some embodiments, transistor device 10 is a power MOSFET. In other embodiments, transistor device 10 is a power IGBT.

Transistor device 10 comprises a first load terminal 11, a second load terminal 14 and a control terminal 12. Furthermore, transistor device 10 comprises an auxiliary terminal 13 associated with load terminal 14. For example, in some embodiments load terminal 14 may be an emitter terminal, and auxiliary terminal 13 may be an auxiliary emitter terminal. In other embodiments, load terminal 14 may be a source terminal, and auxiliary terminal 13 may be an auxiliary source terminal.

Furthermore, the device of FIG. 1 comprises an evaluation circuit 15 to detect a short circuit condition. In embodiments, evaluation circuit 15 evaluates a magnitude of a control signal at control terminal 12 and a magnitude of a signal at load terminal 14. The signals at terminals 12, 14 may be evaluated with reference to a signal level at auxiliary terminal 13. For example, a gate voltage may be applied between terminals 12, 13 and the magnitude of the gate voltage is evaluated in evaluation circuit 15, and a voltage at load terminal 14 may also be evaluated with respect to a voltage at auxiliary terminal 14 (for example as a voltage between emitter terminal and auxiliary emitter terminal). In some embodiments, the signal at load terminal 14 is caused by a voltage drop of a load current, comprising e.g. an inductive voltage drop caused by a rising load current. In embodiments, a short circuit condition is detected when an absolute signal magnitude at terminal 12 exceeds a first threshold, and simultaneously an absolute signal magnitude at terminal 14 exceeds a second threshold.

In case evaluation circuit 15 detects a short circuit condition, countermeasures may be taken. For example, in some embodiments evaluation circuit 15 may control transistor device 10 to open (for example by applying a corresponding signal at terminal 12), such that any current flow is interrupted. In other embodiments, the current flow may be merely reduced, e. g. by changing or influencing the corresponding signal at terminal 12.

To further illustrate this, more detailed embodiments will be described next by way of example only. In the following embodiments, as an example for a transistor device an insulated gate bipolar transistor (IGBT) is used. However, this is merely for ease of reference, and corresponding principals may also be applied to other transistors (for example power MOSFETs and/or super junction MOSFETs and/or other kind of field effect transistors, for example silicon carbide (SiC) based junction field effect transistors (JFETs)).

Figure 2:
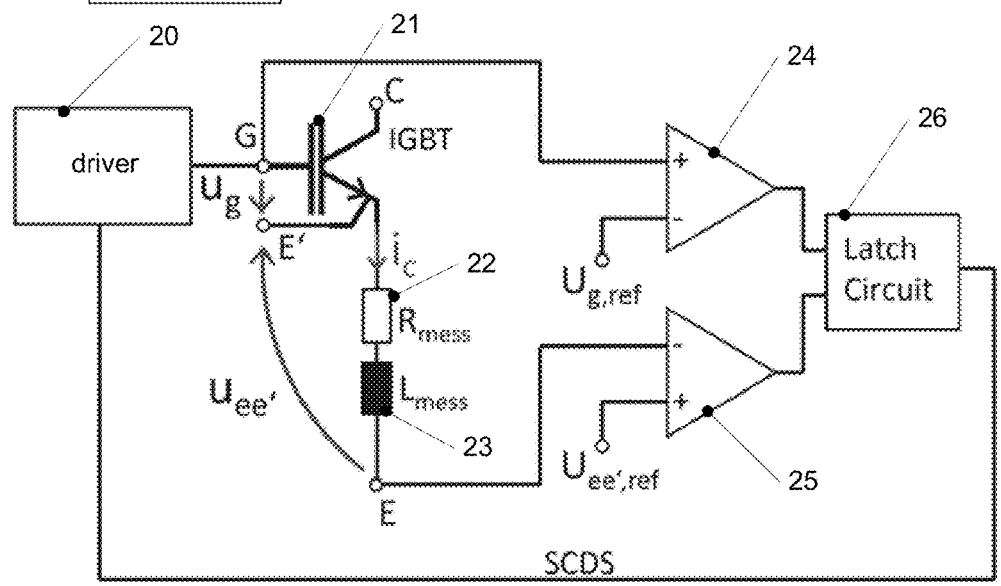
FIG. 2 is a circuit diagram of a device according to an embodiment.

FIG. 2 is a circuit diagram of a device according to an embodiment. The device of FIG. 2 comprises an IGBT 21 as a power switch device, which in a closed state carries a current is between a collector terminal C and an emitter terminal E. A resistor 22 and an inductivity 23 may represent for example a bond wire coupling the emitter terminal E to a emitter contact of transistor 21 on a chip die thereof. G represents a gate terminal of transistor 21, and C represents a collector terminal. Typical inductivities of inductivity 23 are in the range of some nH, for example about 5 nH. With large currents $i_c$ and therefore large current slopes $di_c/dt$ when switching transistor 21, such a comparatively small inductivity may have significant effects and provide a comparatively large voltage drop during such switching events. E' represents an auxiliary emitter terminal, which is also coupled to the emitter contact of transistor 21, for example also via a bond wire. While this bond wire also has a resistance and an inductivity, as no large currents flow via auxiliary emitter terminal E', the effects of this bond wire are considerably smaller.

A voltage between gate terminal G and auxiliary emitter terminal E' is labeled gate voltage $u_g$ in FIG. 2, and a voltage between emitter terminal E and auxiliary emitter terminal E', which is caused mainly by a voltage drop over resistor 22 and inductivity 23, is labeled $u_{ee'}$.

A driver circuit 20 applies the gate voltage $u_g$ to selectively close or open transistor 21 in normal operation.

To detect a possible short circuit, the device of FIG. 2 comprises a first comparator 24 and second comparator 25. First comparator 24 compares the gate voltage $u_g$ with a reference voltage $U_{g,ref}$. In the embodiment of FIG. 2 gate terminal G is coupled with a positive input of comparator 24, and voltage $U_{g,ref}$ is coupled with a negative input of comparator 24. In other embodiments, the logic may be reversed. $U_{g,ref}$ is a reference voltage with respect to the voltage at auxiliary emitter terminal E', such that it is only necessary to couple gate terminal G with comparator 24, without explicitly coupling auxiliary emitter E' with comparator 24. In other words, in the embodiment of FIG. 2 a voltage at auxiliary emitter terminal E' is used as a reference for voltages $U_{g,ref}$. In other embodiments, a differential comparator 24 may be used, which is coupled both with gate terminal G and auxiliary emitter E', such that the voltage at auxiliary emitter terminal E' is explicitly fed to the comparator and not only used as a reference. When the voltage $u_g$ exceeds the reference voltage $U_{g,ref}$, comparator 24 for example outputs a logic 1, and otherwise outputs a logic 0.

Furthermore, the emitter terminal E is coupled with a negative input of comparator 25, and a reference voltage $U_{ee',ref}$ is coupled with the positive input of comparator 25. In this respect, it has to be noted that both $u_{ee'}$ and $U_{ee',ref}$ are negative referred to a voltage at the auxiliary emitter terminal E', which again serves as a reference in the embodiment of FIG. 2. In other embodiments, a voltage at auxiliary emitter terminal E' may be explicitly fed to comparator 25, as has been explained above for comparator 24. Therefore, when the an absolute value of (negative) voltage $u_{ee'}$ exceeds the absolute value of (negative) voltage $U_{ee',ref}$, comparator 25 outputs a logic 1 and otherwise a logic 0. When both comparators 24, 25 output a logic 1 simultaneously, a latch circuit 26 detects a short circuit condition and outputs a signal SCDS indicating this short circuit condition to driver 20. For example, latch circuit 26 may comprise an AND gate, such that signal SCDS corresponds to logic 1 when a short circuit is detected. Responsive to the signal SCDS, driver 20 in case of a short circuit may then open transistor 21 to interrupt the current $i_c$ or control transistor 21 to limit the current $i_c$.

In some embodiments, latch circuit 26 comprises an AND gate followed by an asynchronous flip flop. The asynchronous flip flop "holds" the signal SCDS on a value indicating a short circuit (for example logic 1) once the short circuit has been detected (both comparators 24, 25 output a logic 1) even if later one of the comparators outputs a 0 again (for example when transitioning from area 46 to the non-overlapping part of area 45 in FIG. 4).

While in FIG. 2 latch circuit 26 and driver 20 are depicted as separate entities, latch circuit 26 may be a part of driver 20 in some embodiments. The response of driver 20 to a short circuit being detected may be designed in any desired manner. For example, an opening of transistor 21 may be performed comparatively slowly, for example with a comparatively high gate resistance and/or with a higher gate voltage than usually used for opening the transistor (for example zero Volt instead of a negative voltage) to avoid a voltage peak when opening transistor 21.

Figure 3:
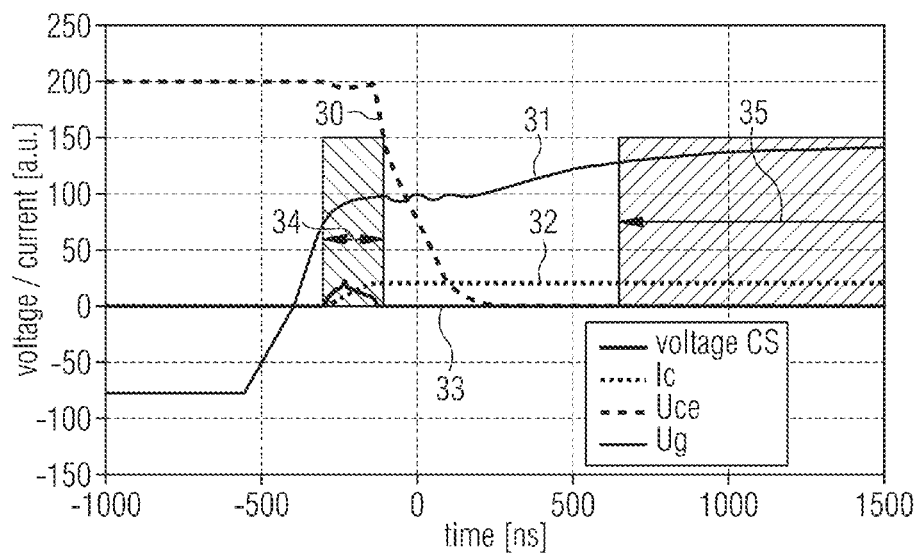
FIGS. 3 and 4 are diagrams illustrating some features of some embodiments.
Figure 4:
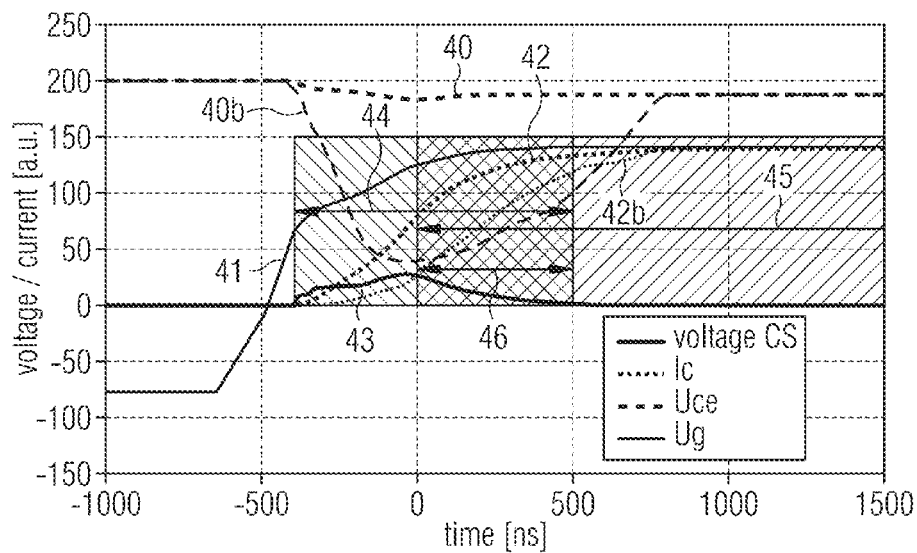

To illustrate the detection of a short circuit with a device as illustrated in FIG. 2 further, FIGS. 3 and 4 show example switching behaviors of an example IGBT. FIG. 3 illustrates a switching behavior in normal operation, and FIG. 4 shows a behavior in case of a short circuit. FIGS. 3 and 4 show various voltages or currents in arbitrary units over time. The curves of FIGS. 3 and 4 are merely for illustration, and time scale and the form of the curves may vary depending on an implementation of a transistor and control thereof. Typical voltages switched by such a transistor in power applications may be of the order of 300 to 1200 V, although higher and lower voltages are also possible. Typical currents may be of the order of 10 A or 100 A or 1000 A but all other values are also possible.

FIG. 3 shows a closing of a transistor (switching on) with an inductive load. In FIG. 3, a curve 30 denotes a collector-emitter voltage, a curve 31 shows a gate voltage (for example $u_g$ in FIG. 2), a curve 32 illustrates a load current (for example $i_c$ in FIG. 2), and a curve 33 shows essentially a derivative of curve 32 with respect to time (di/it). A variation of the current with respect to time may cause an induced voltage as seen by an inductive current sensor, e.g. a voltage drop over inductivity 23 of FIG. 2. An area 35 illustrates an area where the gate voltage 31 has values above a reference voltage (for example $U_{g,ref}$ in FIG. 2), which is at about 100 a.u. in FIG. 3. In FIG. 3, the collector emitter voltage (curve 30) decreases to a saturation value, and during this decrease the gate voltage (curve 31) is held at the Miller plateau (Miller effect), and the reference voltage is above the Miller plateau in the embodiment of FIG. 3. The voltage level of the Miller plateau may vary e.g. depending on a current level to which the switch is switched on.

An area 34 is an area where the current increases stronger than a predetermined current slope (increase of curve 32, curve 33 above a reference value, for example a reference value corresponding to an inductive voltage drop of $U_{ee',ref}$ in FIG. 2). As can be seen, areas 34, 35 do not overlap in case of FIG. 3.

FIG. 4 shows a corresponding diagram for a short circuit. A curve 40 shows a collector-emitter voltage, a curve 41 illustrates a gate voltage, a curve 42 illustrates a load current and a curve 43 illustrates the derivative of the current with respect to time, i.e. curves 40 to 43 in FIG. 4 correspond to curves 30 to 33 in FIG. 3, respectively. As can be seen, due to the short circuit the current (curve 42) rises to considerably higher values than in case of FIG. 3. Furthermore, in case of FIG. 4 an area where the current increases (44 in FIG. 4) overlaps with an area 45 where the gate voltage (curve 41) is higher than the same reference voltage as used for area 35 of FIG. 3. The overlapping region is labeled 46 in FIG. 4. It should be noted that in FIG. 4 there is no Miller plateau, as due to the short circuit the transistor cannot reduce its collector-emitter voltage as in case of FIG. 3.

Therefore, as can be seen from comparing FIGS. 4 and 3, in case of a short circuit, there is the region 46 where the gate voltage (curve 41) is above a threshold voltage, and the derivative of the current over time (43) is non-zero. This changing current in the embodiment of FIG. 2 causes a voltage drop over inductivity 23, and which leads to a correspondingly high voltage $u_{ee'}$, in particular this voltage being above the threshold $U_{ee',ref}$. Therefore, as explained previously, a short circuit may be detected when both $u_g$ and $u_{ee'}$ have absolute values above correspondingly chosen thresholds ($U_{g,ref}$ and $U_{ee',ref}$ in FIG. 2).

In other words, in the situation of FIG. 3, comparators 24, 25 of FIG. 2 output a logic 1 at different, separate times (for example comparator 25 during area 34 in FIG. 3 and comparator 24 during area 35 in FIG. 3), while in case of a short circuit as shown in FIG. 4 both comparators output a logic 1 simultaneously for a certain time (for example during area 46 of FIG. 4).

With the approach explained above, both short circuits during turn-on of the transistor as illustrated in FIGS. 3 and 4 (also referred to as short circuit mode 1 herein) and short circuits occurring when the transistor is already switched on and a constant load current is flowing prior to the short circuit event (also referred to as short circuit mode 2 herein) may be detected. With a short circuit mode 2 when the transistor is already closed, the gate voltage is already at its end value (i.e. above the threshold), and the short circuit leads to rapid increase in current and therefore leads to the voltage $u_{ee'}$ also exceeding the threshold as above. Therefore, not only short circuits when switching on the transistor as illustrated in FIG. 4, but also short circuits when the transistor is already switched on may be detected.

Slight differences also may occur when there is a remaining stray inductance in a path causing the short circuit. Such a stray inductance is limiting the slope of the current increase starting at the incident of the short circuit. FIG. 4 as explained above shows a short circuit mode 1 with a small stray inductance in the short circuit path. In case there were a higher stray inductance, curve 40 representing the collector-emitter voltage would show a stronger dip during the time where there is an increase of the load current 43. Since the increase of the load current is controlled by the increase of the gate-emitter voltage shown in curve 41, an overload or a short circuit could be detected also with a remaining stray inductance which is so high that the dip in the collector-emitter voltage may almost reach a level as at normal switching on of the transistor.

For comparison purposes, a curve 40b in FIG. 4 represents a high inductive short circuit mode 1 with a slower increase of the load current shown in curve 42b. As can be seen, also here a detection of the short circuit is possible using the techniques described herein. A high inductive short circuit mode 2 may be detected in a corresponding way.

The reference voltage $U_{ee',ref}$ in embodiments, as follows from the above explanations, may be chosen such that the resistive voltage drop of the load current of transistor 21 is not sufficient to exceed the threshold in normal operation, but an additional inductive voltage drop over inductivity 23 when the current $i_c$ increases or a significantly higher load current $i_c$ than in normal operation is needed to exceed there reference voltage $U_{ee',ref}$.

In some embodiments, $U_{ee',ref}$ therefore may be chosen such that an ohmic voltage drop of the transistor 22 is sufficient in case $i_c$ exceeds a nominal value (for example when it three times the nominal value). In this case, also short circuits with loads having a very high inductivity, which leads to a slow increase of the current (lower di/dt) may be detected, as such low di/dt leads to a low voltage at inductivity 23.

Figure 5:
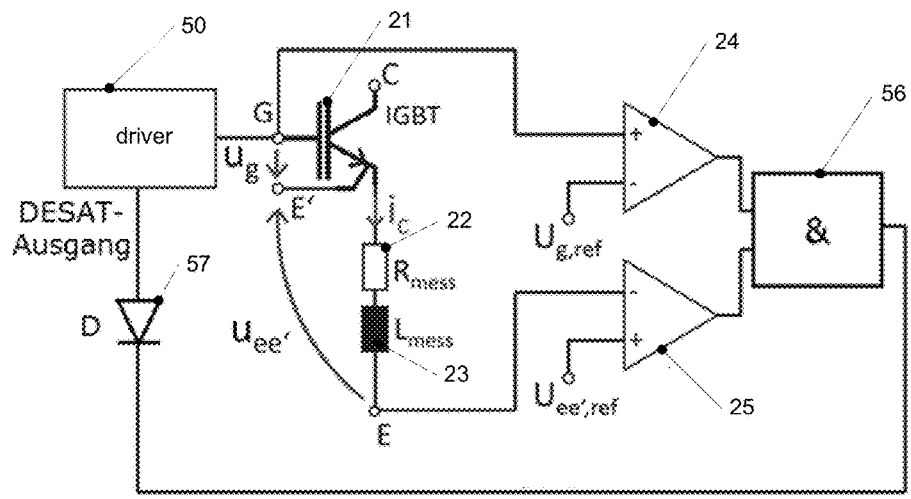
FIG. 5 is a circuit diagram illustrating a device according to an embodiment.

Embodiments may be used with conventional drivers using a desaturation of a transistor to detect a short circuit. A corresponding embodiment is illustrated in FIG. 5. In order to avoid repetitions, elements common to the embodiments of FIGS. 5 and 2 bear the same reference numerals and will not be discussed again in detail. In FIG. 5, a conventional driver 50 is used to control transistor 21. Driver 50 has a desaturation (DESAT) output terminal which in conventional approaches would be used for detecting a desaturation state of transistor 21 to detect a short circuit. In the embodiment of FIG. 5, this pin or terminal instead is used sensing a short circuit condition indicated by the detection approach discussed above with respect to FIGS. 2 to 4. In particular, in FIG. 5 outputs of the comparators 24, 25 are fed to an AND gate 56, which may be followed by a latching element like an asynchronous flip-flop and/or by a delay element (not shown in FIG. 5). The output of AND gate 56 is coupled with the DESAT output terminal of driver 50 via a diode 57. Driver 50 provides a low constant current at the DESAT terminal, which conventionally is coupled via diode 57 with collector terminal C of transistor 21. In many conventional cases transistor modules, in particular IGBT modules, may have an additional collector terminal (auxiliary collector terminal) for this case. When transistor 21 is in desaturation, i.e. the collector emitter voltage exceeds a threshold (for example by several Volts), driver 50 cannot drive the above-mentioned constant current anymore against this voltage and thus detects an error.

In the device of FIG. 5, AND gate 56 outputs a zero (for example zero Volt) in case no short circuit is detected, and the above-mentioned constant current output by driver 50 may be sunk to this zero Volt level and therefore be driven by driver 50. In case of a short circuit, both comparators 24 and 25 as output above output a logic 1, and therefor AND gate 56 outputs a logic 1, which may for example correspond to a voltage in the range of 12 to 15 Volt. Against such a voltage, driver 50 cannot drive the constant current any longer, and therefore detects the short circuit condition and takes appropriate measures, for example switching off (opening) transistor 21.

In the embodiment of FIG. 5, for example comparators 24, 25 and AND gate 56 may be integrated in a module, possibly together with transistor 21, which then may be combined with a conventional driver 50. In some embodiments, additionally a low pass filter and/or a latching element like an asynchronous flip-flop may be provided at the output of AND gate 56. These elements may ensure that in case of a short circuit a voltage corresponding to logic 1 is present at the output of AND gate 56 for a sufficiently long time for driver 50 to react.

Figure 6:
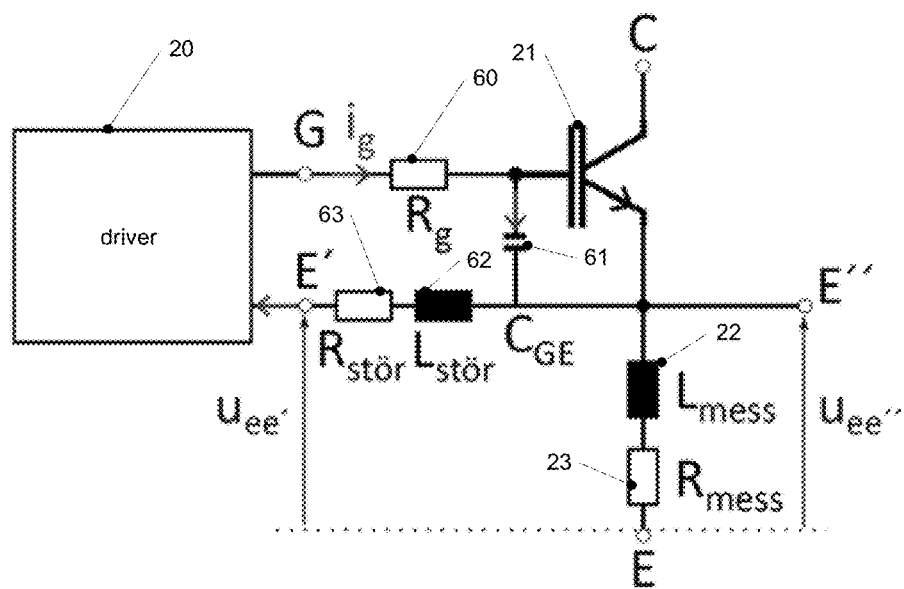
FIG. 6 is a circuit diagram illustrating the use of an additional further emitter terminal according to some embodiments.

In the above embodiments, gate voltage $u_g$ is applied between gate terminal G and auxiliary emitter E', and the voltage $u_{ee'}$ is measured between emitter E and auxiliary emitter E'. In other embodiments, a further auxiliary emitter may be used. A corresponding embodiment is illustrated in FIG. 6. FIG. 6 illustrates a part of a device according to an embodiment. Other parts, for example a short circuit detection, may be implemented using for example two comparators as illustrated in FIGS. 2 and 5.

As illustrated in FIG. 6, when driver 20 controls transistor 21, during switching events a gate current $i_g$ flows via gate terminal G, a gate resistance 60, a gate-emitter capacitance 61 of transistor 21, a resistor 63 and an inductivity 62 to auxiliary emitter terminal E'. Inductivity 62 and resistor 63 may be formed e. g. by a bond wire or another electric connection which, as mentioned previously, couples an emitter contact of transistor 21 with auxiliary emitter terminal E'. Instead of bond wires, also other kinds or connections may be used, for example so-called ribbon bonds or clips. Clips as used here are broader conductive strips, which are copled to metallizations on a chip die via soldering or eutectic approaches, sintering etc. Ribbon bonds or clips are often used for load terminals. Therefore, while bond wires are used as examples herein for some electrical connections, generally electrical connections herein may be implemented in a variety of ways.

Changes of $i_g$ which occur at switching events of transistor 21 may lead to a non-negligible voltage drop over inductivity 62 and resistor 63, which influences the voltage $u_{ee'}$, which in the above explained embodiments was used for detecting a short circuit. In some instances, depending on the magnitude of $di_g/dt$ and the values of inductivity 62 and resistor 63, this voltage drop could lead to an accidental indication of a short circuit with the circuits discussed previously, in particular to comparator 25 accidentally outputting a logic 1. It is to be noted that in other implementations, depending on the voltages and currents used and the particular transistor implementation, this need not be an issue. Such an accidental detection may in particular occur when switching off (opening) transistor 21, as at this time when starting the switching comparator 24 outputs a logic 1, corresponding to areas 35 of FIG. 3.

In such implementations where there is a danger of an accidental short circuit detection although no short circuit is present, in embodiments a further auxiliary emitter E" may be provided as shown in FIG. 6, and instead of the voltage $u_{ee'}$, a voltage $u_{ee''}$ between emitter E and further auxiliary emitter E" may be used for detecting a short circuit condition. Further auxiliary emitter E" may be an additional terminal which is coupled to an emitter contact of transistor 21 for example via one or more bond wires. As further auxiliary emitter E" is only used for obtaining the voltage $u_{ee''}$ and not for gate control, the above explained effects when switching transistor 21 do not affect the voltage $u_{ee''}$.

Figure 7:
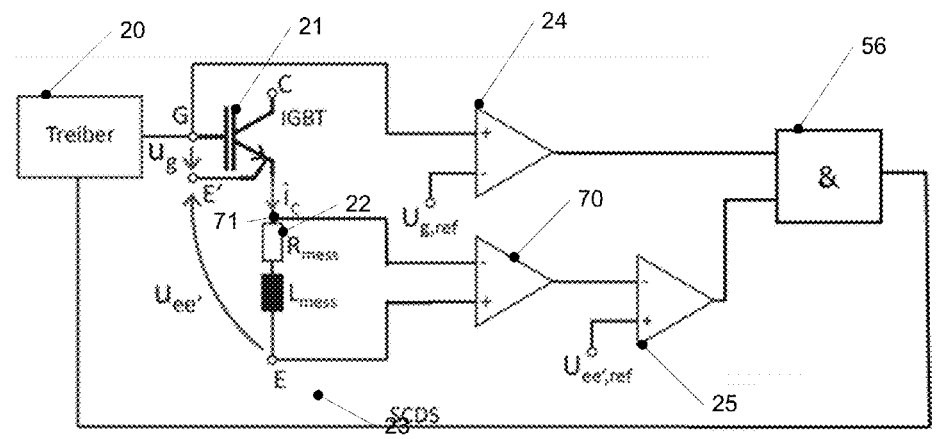
FIG. 7 is a circuit diagram illustrating a device according to an embodiment.

In other embodiments, yet other terminals or internal nodes may be used for measuring an inductive and/or ohmic voltage drop. In embodiments, generally an inductive and/or ohmic voltage drop is measured between two nodes, wherein the load current flows between the two notes. Depending on the nodes, the corresponding reference voltage $U_{ee', ref}$ has to be adjusted accordingly. An example for such an embodiment is shown in FIG. 7. Again, elements or components already discussed previously bear the same reference numerals and will not be discussed again in detail.

Instead of measuring voltage $u_{ee'}$, in the embodiment of FIG. 7 a voltage between a node 71 and emitter E is measured by a differential amplifier 70 and provided to comparator 25. Apart from a possibly necessary adjustment of $U_{ee', ref}$, the effect is the same as using the voltage $u_{ee'}$, i.e. at high slopes of $i_c$ a high voltage drop over inductivity 23 is generated, which is then used for short circuit detection. Instead of AND gate 56, any other usable latch circuit may be used. Furthermore, instead of driver 20, a driver like driver 50 with a DESAT terminal may be used. Node 71 may for example be a node on a metallic conductive part within a package containing transistor 21 or directly on the chip metallization of the transistor 21.

In some implementations, when switching on the transistor comparatively strong oscillations in the load current $i_c$ may occur, which in some cases may lead to an accidental detection of a short circuit although no short circuit is present. In implementations where this may occur, a detection circuit detecting oscillations may be used, which deactivates the short circuit detection (for example by setting an output of latch circuit 26 in FIG. 2 to zero) temporarily, for example for a pre-defined time, when oscillations are detected. For example, such a deactivation may be performed when a negative $di_c/dt$ is detected, for example via a positive voltage drop over inductivity 23. Such a negative value of $di_c/dt$ does usually not occur during a short circuit, where $i_c$ increases as explained with reference to FIG. 4.

As shown above, using a measurement of a voltage drop over resistance 22 and inductivity 23, which may be a parasitic resistance and inductivity of a bond wire or another suitable electric connection e.g. as explained above, a hard short circuit (where the current rapidly increases) may be detected mainly via the voltage drop over the inductivity, while a "soft" short circuit with a slower increase of the current may be detected via a voltage drop over a resistance like resistance 22. For detecting only a hard short circuit with a high inductive voltage drop, a higher threshold voltage at comparator 25 could be chosen. In contrast, a "soft" short circuit needs a lower reference voltage at comparator 25 to be sensitive enough for short circuits. In embodiments, high reference voltages may be desirable to reduce a likelihood of an erroneous short circuit detections. Therefore, in embodiments the reference voltage $U_{ee', ref}$ supplied to comparator 25 may be adaptable.

For example, in embodiments as long as the gate voltage $u_g$ is below a threshold value, a comparatively higher value of $U_{ee'', ref}$ may be used. As soon as the gate voltage exceeds a certain threshold value, a comparatively lower reference voltage $U_{ee', ref}$ may be used. In such an embodiment, when the transistor is switched on, the gate voltage is low, and a high threshold voltage comparator 25 is used. Therefore, a normal switching on may be performed with a comparatively high robustness against erroneous detections.

When a short circuit is present when the transistor is switched on, the threshold value is exceeded (in particular in case of a low inductive short circuit). In case of a high inductive short circuit (i.e. a short circuit via a high inductivity as a—remaining—load), the gate voltage reaches its maximum value, whereas the $di_c/dt$-behavior is mainly dominated by the short circuit inductivity. When the high gate voltage is used, the voltage drop over resistor 22 and inductivity 23 is compared against a lower threshold voltage, thus being able to detect also this type of fault. Also, through this, the detection may react quickly to very soft short circuits during a switched-on state of the transistor.

In some applications, a plurality of power transistors may be used in combination. In such application, it may happen that switching one of the transistors accidentally triggers a short circuit detection in another one of the transistors. In such cases, to prevent an erroneous short circuit detection during switching of one of the transistors a short circuit detection of another one of the transistors may be temporarily deactivated. An example for such an approach will now be discussed with reference to FIGS. 8 and 9.

Figure 8:
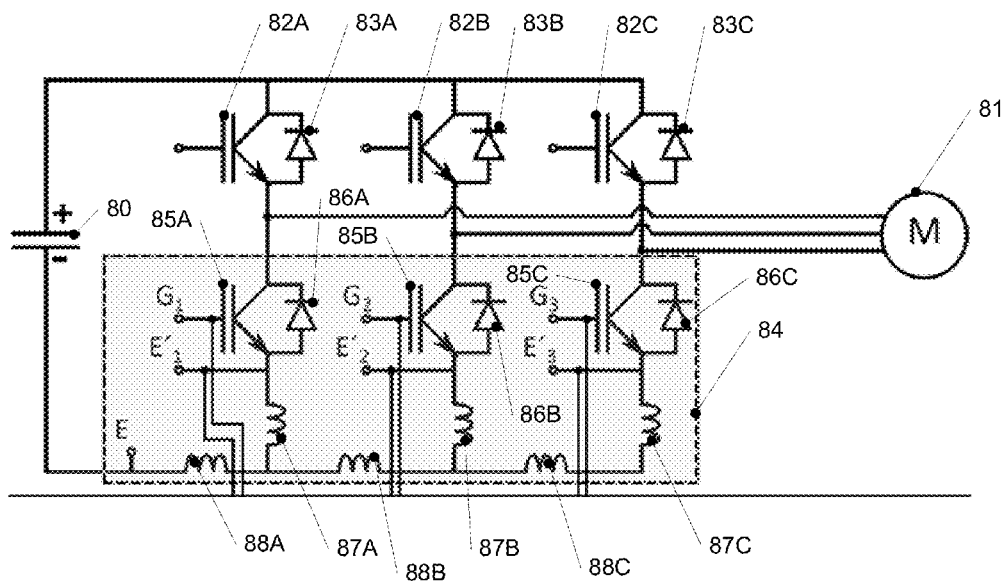
FIG. 8 is a circuit diagram illustrating the use of power transistors for controlling a motor.

FIG. 8 shows an application scenario where power transistors 82A, 82B, 82C, 85A, 85B and 85C are used to control an electric motor 81. In the embodiments of FIG. 8 electric motor 81 is a three-phase motor. Numeral 80 denotes a power source, for example a battery and/or a buffering capacitor. In some embodiments, battery 80 may be a battery of an automobile, and motor 81 may be an electric motor in the automobile. Transistors 82A and 85A form a first half bridge selectively supplying current to a first terminal of motor 81, transistors 82B and 85B form a second half bridge selectively supplying current to a second terminal of motor 81, and transistors 82C and 85C form a third half bridge selectively supplying current to a third terminal of motor 81. Transistors 82A to 82C, 85A to 85C are provided with freewheeling diodes 83A to 83C, 86A to 86C, respectively, as illustrated in FIG. 8.

In embodiments, for cost reasons the transistors 85A to 85C (also referred to as low side transistors), which are generally labeled 84 in FIG. 8, are supplied by a common logic. In particular, transistors 85A, 85B and 85C in FIG. 8 have a common load emitter terminal E, but separate auxiliary emitter terminals $E'_1$, $E'_2$, $E'_3$ and separate gate terminals $G_1$, $G_2$ and $G_3$. For the transistors 82A to 82C in embodiments separate short circuit detection logics with separate emitter terminals E are provided, such that this problem is less of an issue for these transistors.

Numerals 87A to 87C and 88A to 88C indicate parasitic inductivities, for example by bond wires and/or other connecting elements, similar to inductivity 23 of the above-mentioned embodiment.

A short circuit detection for transistors 85A to 85C for example may use a voltage drop between emitter terminal E and the auxiliary emitter terminal E' associated with the respective transistor, as explained previously. However, switching one of transistors 85A to 85C may cause a voltage drop at inductivities 88A to 88C which may lead to an erroneous short circuit detection at another one of the transistors. In embodiments, therefore a short circuit detection for one of the transistors, for example for transistor 85A, is only active when none of the other transistors, for example 85B and 85C, is currently switching. In other words, the detection of a short circuit is only active when the other transistors are in a stable closed or open condition.

This condition may be obtained by monitoring gate voltages at gates $G_1$, $G_2$, $G_3$. For example, when the gate voltage is below a lower threshold, for example zero Volt or minus five Volt, the transistor is in a stable open state. If the gate voltage is above an upper threshold, for example plus eleven Volt, plus twelve Volt etc., the transistor is in a stable closed state. If the gate voltage is between the above-mentioned threshold values, the transistor is evaluated as just switching.

As such switching events usually have a very short duration, for example smaller than one microsecond, the short circuit detection is only deactivated for a short time.

Figure 9:
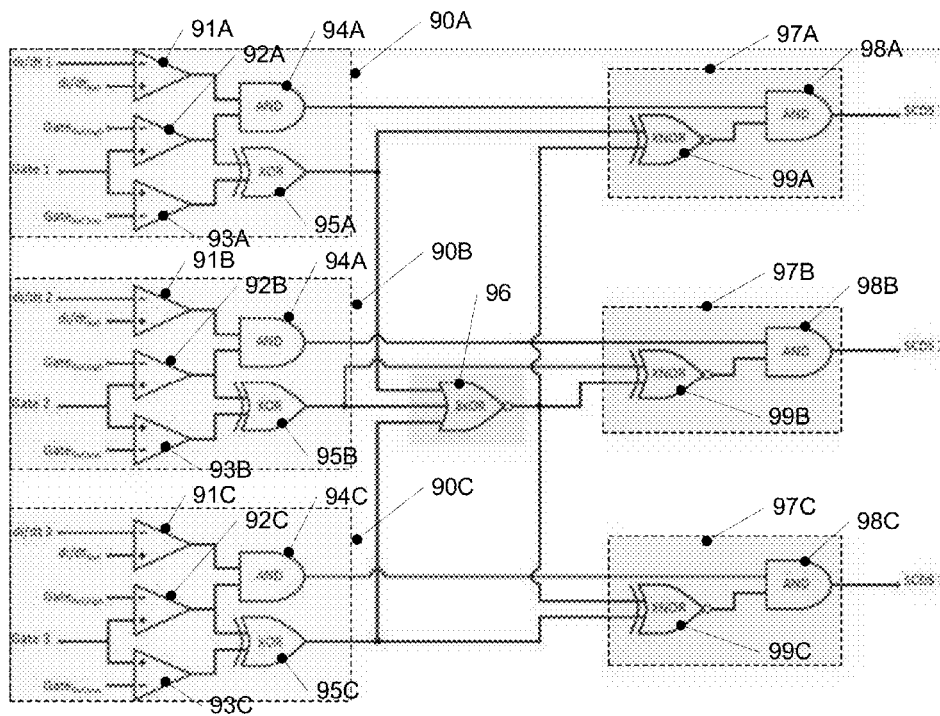
FIG. 9 illustrates a short circuit detection according to some embodiments usable in the device of FIG. 8.

FIG. 9 shows a detection logic which is for example usable for the three transistors 85A to 85C of FIG. 8. For each transistor, an input stage 90A, 90B and 90C, respectively, is provided. In the following, input stage 90A will be described in detail. Input stages 90B, 90C are both implemented correspondingly, and the reference numerals correspond to each other, wherein an "A" for input stage 90A is replaced by a "B" for input stage 90B and a "C" for input stage 90C. For example, component 91A of input stage 90A corresponds to component 91B in input stage 90B and to component 91C in input stage 90C.

Input stage 90A comprises a first comparator 91A, a second comparator 92A and an AND gate 94A. Comparator 91A essentially corresponds to comparator 25 discussed previously for example in FIG. 2 and compares a voltage drop caused by a load current of a first transistor (for example 85A of FIG. 8) at an inductive load (for example an inductivity of a bond wire, as discussed previously) with a reference value. The voltage drop of the first transistor is marked di/dt1 (as the inductive voltage drop depends on the derivative of the load current over time), and the corresponding reference value is marked $di/dt_{ref}$ in FIG. 9. $di/dt_{ref}$ may for example correspond to $U_{ee',ref}$ discussed previously. The values di/dt1 and $di/dt_{ref}$ as explained previously with respect to FIG. 2 are negative values, such that comparator 91A outputs a logic 1 when an absolute value of the voltage drop exceeds a threshold.

Second comparator 92A compares the gate voltage of the first transistor, labeled gate 1 in FIG. 9, with an upper gate voltage threshold $Gate_{ref,high}$, which may correspond to $U_{g,ref}$ of FIG. 2. When the gate voltage of the first transistor exceeds the reference value $Gate_{ref,high}$ second comparator 92A outputs a logic 1. When both comparators 91A, 92A output a logic 1, AND gate 94A outputs a logic 1, which as discussed previously may indicate a short circuit condition.

Furthermore, input stage 98 comprises a third comparator 93A. Third comparator 93A compares the gate voltage Gate 1 with a lower reference value $Gate_{ref,low}$, which is smaller than the reference value $Gate_{ref,high}$. When the gate voltage Gate 1 exceeds the lower gate reference value $Gate_{ref,low}$, third comparator 93A outputs a logic 1 and otherwise a logic 0.

The outputs of second comparator 92A and third comparator 93A are provided to an XOR gate 95A. When the first transistor is in a switched-off state, the gate voltage Gate 1 is low (below the lower reference $Gate_{ref,low}$) and therefore both comparators 92A, 93A output a logic 0. Therefore, in this state XOR gate outputs a logic 0.

When the transistor is fully switched on, gate voltage Gate 1 exceeds both reference voltages $Gate_{ref,high}$ and $Gate_{ref,low}$, and therefore both comparators 92A, 93A output a logic 1. Consequently, in this state XOR gate 95A also outputs a logic 0.

When the transistor is switching, the gate voltage is between $Gate_{ref,low}$ and $Gate_{ref,high}$. In this state, comparator 93A outputs a logic 1, and comparator 92A outputs a logic 0. Consequently, in this state XOR gate 95A outputs a logic 1. To summarize, therefore XOR gate 95A outputs a logic 1 when the transistor is switching, and outputs a logic 0 when the transistor is in a stable switched-off state or in a stable switched-on state.

Therefore, in input stage 90A a second comparator 92A has two functions: on the one hand, it is used for short circuit detection similar to comparator 24 of FIG. 2 (via AND gate 94A), and on the other hand it is used for detecting a switching state of the transistor (via XOR gate 95A). In other embodiments, separate comparators may be used for these two functions, possibly with different threshold values.

As mentioned above, the input stages 90B, 90C operate accordingly.

In the embodiment of FIG. 9, the reference values ($di/dt_{ref}$, $Gate_{ref,high}$ and $Gate_{ref,low}$) are the same for all three input stages 90A, 90B, 90C. In other embodiments, different threshold voltages may be used for different input stages.

The outputs of XOR gates 95A, 95B and 95C are provided to a triple OR gate 96. Therefore, triple OR gate 96 outputs a logic 1 when at least one of the three transistors is currently switching (i.e. its gate voltage between $Gate_{ref,low}$ and $Gate_{ref,high}$) and outputs a logic 0 only when none of the transistors is switching.

Furthermore, the detection logic of FIG. 9 comprises an output stage 97A, 97B and 97C, respectively, for each of the transistors. The output stages 97A to 97C have the same structure, and similar to the input stages only output stage 97A will be described in detail, the other output stages 97B, 97C operating accordingly.

Output stage 97A comprises an AND gate 98A and an XNOR gate 99A. XNOR 99A receives outputs from XOR gate 95A and from triple OR gate 96. When both XOR gate 95A and triple OR gate 96 output a logic 0 (none of the transistors is switching), XNOR gate 99A outputs a logic 1. When both XOR gate 95A and triple OR gate 96 output a logic 1 (the first transistor is switching), XNOR gate 99A also outputs a logic 1. In these two cases, AND gate 98A, which receives an output of XNOR gate 99A and of AND gate 94A, has an output state according to the output state of AND gate 94A, and therefore the short circuit detection provided by AND gate 94A is output. In other words, in these cases the short circuit detection is enabled.

However, when XOR gate 95A outputs a logic 0, and triple OR gate 96 outputs a logic 1, this means that the first transistor is not switching, but one of the other transistors is currently switching. In this case, XNOR gate 99A outputs a logic 0, and therefore AND gate 98A also outputs a logic 0, thus effectively disabling the short circuit detection for the first transistor during a switching of one of the other two transistors (or both). The same applies to the other transistors.

It should be noted that while FIGS. 8 and 9 show examples for three transistors, application of the techniques described here are not limited to three transistors (or three half bridges as in FIG. 8) but may be applied to any plurality of transistors (for example two transistors or four or more transistors, two half bridges or four or more half bridges) where a switching event in one of the transistors may lead to an erroneous short circuit detection in one of the other transistors.

Figure 10:
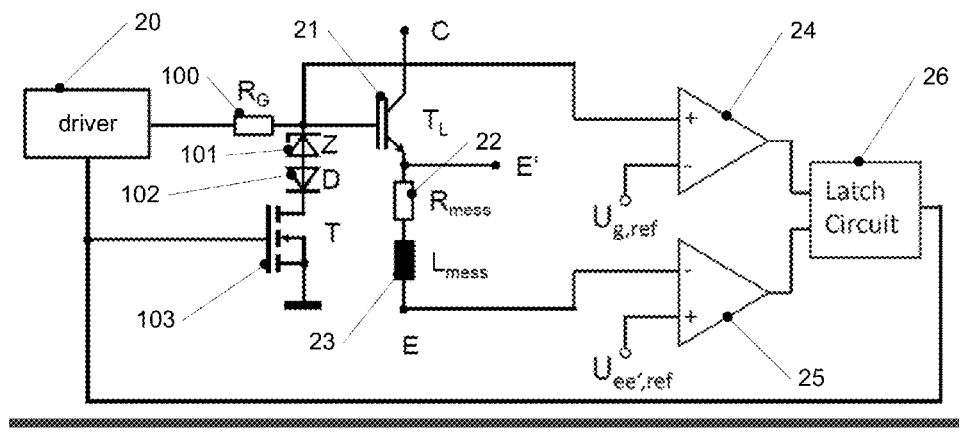
FIG. 10 is a circuit diagram of a device according to an embodiment.

As mentioned previously, in some embodiments instead of switching a transistor of completely immediately, at least at first the current may be reduced. FIG. 10 illustrates a corresponding embodiment. Again, to avoid repetitions, features and elements already discussed in previous FIGS. Like FIG. 2 bear the same reference numerals, and will not be discussed again in detail.

In FIG. 10, a gate resistance 100 is additionally explicitly shown, although such a gate resistance may also be present in other embodiments. Moreover, the gate terminal of transistor 21 in the embodiment of FIG. 10 is coupled to ground via a Zener diode 101, an optional diode 102 and a transistor 103. Transistor 103 is controlled by the short circuit detection signal output by latch circuit 26.

As long as no short circuit is detected, transistor 103 is open, and the path provided by Zener diode 101, diode 102 and transistor 103 essentially has no effect on the operation of the device shown. As soon as a short circuit is detected, the output signal of latch circuit 26 closes transistor 103. This reduces the gate voltage of transistor 21 to the reverse voltage of Zener diode 101, for example to between 8 and 12 V. Therefore, transistor 21 is still operated despite the short circuit, but with a reduced gate voltage and consequently lower load current, which causes a reduced power dissipation. Under these conditions, transistor 21 may carry the short circuit current longer without being damaged. After some time, driver 20 then may completely switch off transistor 21. For example, driver 20 may switch off transistor 21 based on the signal from latch circuit 26, or may use a conventional desaturation based short circuit detection.

Diode 102 is optional and prevents a current flow from ground to driver 20 via gate resistor 100 when transistor 21 is open and a negative gate voltage is used for opening transistor 21.

Figure 11:
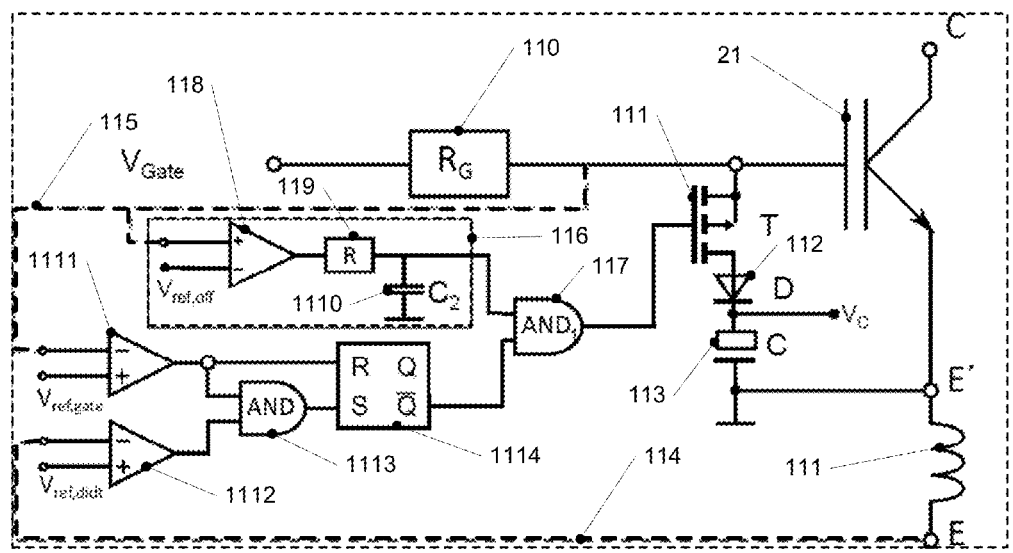
FIG. 11 is a circuit diagram illustrating a device according to an embodiment.

FIG. 11 illustrates a device according to a further embodiment. The device of FIG. 11 again comprises transistor 21, which is controlled via a gate voltage $V_{gate}$ using a gate terminal via a gate resistor 110. Moreover, transistor 21 has a collector terminal C, an emitter terminal E and an auxiliary emitter terminal E' as explained previously. 111 represent inductivities and resistances between auxiliary emitter terminal E' and emitter terminal E, for example caused e. g. by bond wires as explained previously.

The embodiment of FIG. 11 comprises a short circuit detection circuit as explained previously, with comparators 1111 and 1112 corresponding to comparators 24, 25 explained previously. $V_{ref,gate}$ corresponds to $U_{g,ref}$ explained previously, and $V_{ref,di/dt}$ corresponds to $U_{ee',ref}$ explained previously. The outputs of comparators 1111, 1112 are fed to an AND gate 1113, which for example corresponds to AND gate 56 discussed previously. Therefore, an output of logic 1 from AND gate 1113 indicates a short circuit condition.

Furthermore, the embodiment of FIG. 11 comprises additional circuitry, the function of which will be explained next.

A circuit portion 116 comprises a comparator 118 and a low pass filter formed by a resistor 119 and a capacitor 1110. Comparator 118 compares the gate voltage with a reference voltage $V_{ref}$. When the gate voltage is smaller than the voltage level $V_{ref,off}$(e. g. 0 V) indicating a switched-off state of transistor 21, comparator 118 outputs a logic 0 to the above-mentioned low path. Therefore, AND gate 117 output a logic 0, which causes transistor 111 which in the embodiment of FIG. 11, is a p channel MOSFET, to close. Therefore, the gate voltage at a gate contact of transistor 21 is drawn to a predetermined value $V_c$ via transistor 111 and diode 112.

When now the gate driver is activated to close transistor 21, as diode 112 is blocking the potential at the gate of transistor 21 may rise to $V_c$ and beyond. Prior to reaching $V_c$, $V_{ref,off}$ is exceeded at comparator 118, such that comparator 118 outputs a logic 1 to low path 119, 1110. Therefore, the input of AND gate 117 coupled to block 116 rises to logic 1 according to the time constant of the low pass filter.

An output of AND gate 1113 is coupled to a flip-flop 1114, and an inverted output of flip-flop 1114 is coupled to an input of AND gate 117. When at the above mentioned closing of transistor 21 no short circuit is present, AND gate 1113 outputs a logic 0 and therefore the inverted output of flip flop 1114 outputs a logic 1 to AND gate 117. When both inputs of AND gate 117 are at logic 1 (after the time constant of the low pass filter), AND gate 117 outputs a logic 1, thus opening transistor 111. Therefore, the gate voltage can continue to rise, finally closing transistor 21. In the embodiment of FIG. 11, AND gate 117 is designed such that a logic 1 at the output of AND gate 117 reaches a minimum voltage which is given by the operating gate voltage of transistor 21 which may be e. g. in a range of e. g. 8 to 18V. In other embodiments, logic gates with standard logic levels like 3.3V for logic 1 may be used. In this case, a level shifter or other suitable circuit may be used to provide a suitable gate control voltage based on the voltage output by a logic gate like AND gate 117.

If, however, a short circuit is present, the output of the inverted output of flip-flop 1114 is 0 (as in this case AND gate 1113 outputs a logic 1), and transistor 111 keeps conducting. This inhibits a rise of a gate voltage of transistor 21 at least to some extent, thus delaying the transistor from turning fully on and therefore reducing a probability that transistor 21 is damaged prior to being turned off due to the detected short circuit.

Reference number 113 in FIG. 11 denotes a capacitance providing voltage $V_c$. Instead of capacitance 113, also a Zener diode may be provided. $V_c$ may be for example of the order of e. g. 5 to 12 V in some embodiments.

Furthermore, a reset input R of flip-flop 1114 is coupled with the output of comparator 1111. This may lead to a self-reset functionality of flip-flop 1114 after a short circuit condition has passed.

$V_{ref,off}$ may be selected depending on how transistor 21 is driven. When the gate voltage is set to negative voltage for opening transistor 21, $V_{ref,off}$ may be set for example to 0 V or to a negative voltage. When the gate voltage is set to 0 V for opening transistor 21, $V_{ref,off}$ may for example be set to a value between 0 V and the threshold voltage of transistor 21.

The logic illustrated in FIG. 11 may be adapted for the use of an n channel transistor instead of p channel transistor 111, by changing the logic levels accordingly.

As already mentioned, the various modifications shown may be combined with each other. For instance, while several embodiments show modifications of the embodiment of FIG. 2, two or more of these modifications from different embodiments may be implemented jointly.

Figure 12:
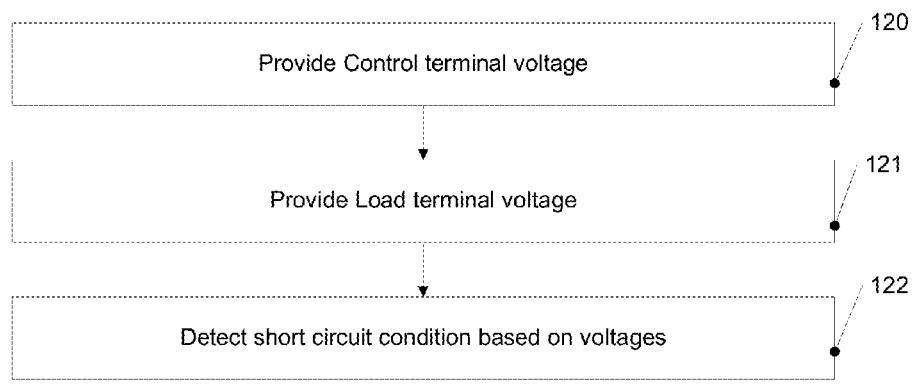
FIG. 12 is a flow chart illustrating a method according to an embodiment.

FIG. 12 illustrates a method according to an embodiment. While the method of FIG. 12 is shown and described as a series of acts or events, the order in which these acts or events are presented is not to be construed as limiting. The method of FIG. 12 may be implemented using the devices shown and discussed with reference to FIGS. 1 to 11, but is not limited thereto. Modifications and variations discussed with respect to the devices of FIGS. 1 to 11 may also be applied to the method of FIG. 12.

At 120 in FIG. 12, a voltage at a control terminal of a semiconductor switch, for example a gate voltage of an IGBT or MOSFET, is provided. At 121, a voltage caused by voltage drop of a load current at a load terminal, for example a voltage between emitter and auxiliary emitter as described above, is provided. At 122, a short circuit condition is detected based on a magnitude of the voltages provided at 120 and 121. For example, as explained above, a short circuit condition may be determined when both voltages exceed respective magnitudes (in particular absolute magnitudes) at a same time.

As already mentioned, the embodiments above should be construed as limiting, but merely serve illustrative purposes.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A device, comprising:
  a semiconductor switch comprising a control terminal and at least two load terminals; and
  an evaluation circuit configured to detect a short circuit condition based on a magnitude of a signal at the control terminal and based at least in part on a magnitude of a variation of a load current via the at least two load terminals,
  wherein the evaluation circuit comprises a first comparator configured to compare the control signal with a first reference value, a second comparator configured to compare a value representative at least in part of the change of load current with a second reference value, wherein the evaluation circuit is configured to evaluate a voltage drop over an inductivity to determine a measure of the magnitude of the variation of the load current, and wherein the inductivity comprises an inductor that is connected between a first one of the load terminals and a first input of the second comparator.

2. The device of claim 1, wherein the evaluation circuit is configured to obtain the voltage drop between one of the at least two load terminals and an auxiliary terminal associated with the one of the at least two load terminals.

3. The device of claim 2, further comprising a driver configured to apply the control signal between the control terminal and the auxiliary terminal.

4. The device of claim 2, further comprising a driver configured to apply the control signal between the control terminal and a further auxiliary terminal associated with the one of the at least two load terminals.

5. The device of claim 1, wherein the evaluation circuit comprises a first comparator configured to compare the control signal with a first reference value, a second comparator configured to compare a value representative at least in part of the change of load current with a second reference value, and a logic configured to output a signal indicating a short circuit based on an output of the first comparator and an output of the second comparator.

6. The device of claim 5, wherein the device is configured to change the second reference value based on a value of the control signal.

7. The device of claim 1, wherein the evaluation circuit is configured to determine that a short circuit condition is present when an absolute value of the control signal exceeds a first threshold and an absolute value indicative of a change of load current simultaneously exceeds a second threshold.

8. The device of claim 1, wherein the evaluation circuit is configured to temporarily disable the short circuit detection upon detection of a negative slope of the load current.

9. The device of claim 1, wherein the semiconductor switch is one of a metal oxide semiconductor field effect transistor or an insulated gate bipolar transistor.

10. The device of claim 1, further comprising a further semiconductor switch, wherein the evaluation circuit is configured to disable short circuit detection for the semiconductor switch during a switching event of the further semiconductor switch.

11. The device of claim 1, wherein the evaluation circuit is configured to partially open the semiconductor switch to reduce the load current upon detection of a short circuit.

12. A device, comprising:
  a power transistor comprising a first load terminal, a second terminal and a control terminal;
  a first comparator comprising a first input coupled with the control terminal and a second input to be coupled with a first reference voltage;
  a second comparator comprising a first input coupled with the second load terminal and a second input to be coupled with a second reference voltage; and
  an AND gate comprising a first input coupled with an output of the first comparator and a second input coupled with an output of the second comparator,
  a driver comprising an output coupled to the control terminal and a further terminal coupled with an output of the AND gate,
  wherein the further terminal of the driver is a desaturation test current output terminal.

13. A device, comprising:
a power transistor comprising a first load terminal, a second terminal and a control terminal;
a first comparator comprising a first input coupled with the control terminal and a second input to be coupled with a first reference voltage;
a second comparator comprising a first input coupled with the second load terminal and a second input to be coupled with a second reference voltage;
an AND gate comprising a first input coupled with an output of the first comparator and a second input coupled with an output of the second comparator;
a set/reset flip-flop coupled to an output of the AND gate;
a third comparator comprising a first input coupled with the control terminal,
a second input to be coupled with a third reference voltage; and
and an output coupled with an input of a low pass filter,
wherein an output of the low pass filter and an output of the flip-flop are coupled with a further AND gate,
wherein an out-put of the further AND gate is coupled with a con-trol input of a further semiconductor switch, a first load terminal of the further semiconductor switch is coupled with a control input of the transistor and a second load terminal of the further transistor is to be coupled with a reference potential.

14. The device of claim 1, wherein the device comprises a chip package comprising a semiconductor die and a plurality of externally accessible terminals, wherein the semiconductor die provides the semiconductor switch, wherein a first one of the externally accessible terminals provides the first load terminal, and wherein the inductor is provided by an electrically conductive bond wire connected between the semiconductor die and the first externally accessible terminal.

* * * * *

UNITED STATES PATENT AND TRADEMARK OFFICE
CERTIFICATE OF CORRECTION

PATENT NO. : 10,254,327 B2
APPLICATION NO. : 15/058632
DATED : April 9, 2019
INVENTOR(S) : Mauder et al.

Page 1 of 1

It is certified that error appears in the above-identified patent and that said Letters Patent is hereby corrected as shown below:

On the Title Page

Item (74), the Attorney, Agent, Firm name, please change "Muphry" to --Murphy--.

In the Claims

Claim 13 (Column 17, Line 18) please remove "and".

Claim 13 (Column 18, Line 4) please change "con-trol" to --control--.

Signed and Sealed this
Twenty-fifth Day of June, 2019

Andrei Iancu
*Director of the United States Patent and Trademark Office*